(12) United States Patent
Ji

(10) Patent No.: US 12,273,124 B2
(45) Date of Patent: Apr. 8, 2025

(54) SYSTEMS AND METHODS FOR IRREGULAR ERROR CORRECTION CODE CONSTRUCTION IN ORDER OF WEIGHTS

(71) Applicant: SK Hynix NAND Product Solutions Corp., Rancho Cordova, CA (US)

(72) Inventor: Young Hoon Ji, Vancouver (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 0 days.

(21) Appl. No.: 18/237,058

(22) Filed: Aug. 23, 2023

(65) Prior Publication Data

US 2025/0070798 A1    Feb. 27, 2025

(51) Int. Cl.
*H03M 13/11*    (2006.01)
*H03M 13/00*    (2006.01)

(52) U.S. Cl.
CPC ..... *H03M 13/1157* (2013.01); *H03M 13/616* (2013.01)

(58) Field of Classification Search
CPC .................. H03M 13/1157; H03M 13/616
USPC ........................................................ 714/781
See application file for complete search history.

(56) References Cited

U.S. PATENT DOCUMENTS

| | | | |
|---|---|---|---|
| 7,165,205 B2 | 1/2007 | Blankenship et al. | |
| 8,966,339 B1 * | 2/2015 | Lu ..................... | H03M 13/1117 714/758 |
| 11,394,403 B1 * | 7/2022 | En Gad ............... | G06F 11/1076 |
| 2007/0162821 A1 * | 7/2007 | Hwang ................ | H03M 13/116 714/758 |
| 2009/0265600 A1 | 10/2009 | Matsumoto et al. | |
| 2010/0269025 A1 * | 10/2010 | Chen ................. | H03M 13/2906 714/E11.032 |
| 2011/0283166 A1 | 11/2011 | Kim et al. | |
| 2013/0031446 A1 * | 1/2013 | Kamiya .............. | H03M 13/116 714/781 |
| 2016/0112066 A1 * | 4/2016 | Ashikhmin ......... | H03M 13/154 714/785 |
| 2020/0097360 A1 * | 3/2020 | Lu ......................... | G11C 29/42 |

* cited by examiner

*Primary Examiner* — James C Kerveros
(74) *Attorney, Agent, or Firm* — HALEY GUILIANO LLP

(57) ABSTRACT

A non-transitory computer-readable medium and related method, including processing circuitry, which performs in-order error correction code construction. The processing circuitry receives a first plurality of matrices. The processing circuitry is to generate a second plurality of matrices based on at least one additive candidate matrix and each respective matrix of the first plurality of matrices. The processing circuitry then generates a third plurality of matrices based on at least one additive test matrix and each respective matrix of the second plurality of matrices. Each respective weight indicative of respective extensibility for each matrix of the second plurality of matrices is determined based on the third plurality of matrices. At least one matrix from the second plurality of matrices is then selected by processing circuitry based on the determined weights. The processing circuitry then generates an error correction code based on one of the at least one selected matrix.

22 Claims, 12 Drawing Sheets

$$H_{exp} = \begin{bmatrix} 0 & 1 \\ 0 & 0 \end{bmatrix}$$

←710

←720

$$H = \begin{bmatrix} 1 & 0 & 0 & 1 \\ 0 & 1 & 1 & 0 \\ 1 & 0 & 1 & 0 \\ 0 & 1 & 0 & 1 \end{bmatrix}$$

706

FIG. 7B $$H_{exp} = \begin{bmatrix} 0 & 1 \\ 0 & 1 \end{bmatrix} \quad \leftarrow 730$$

Figure 7C:
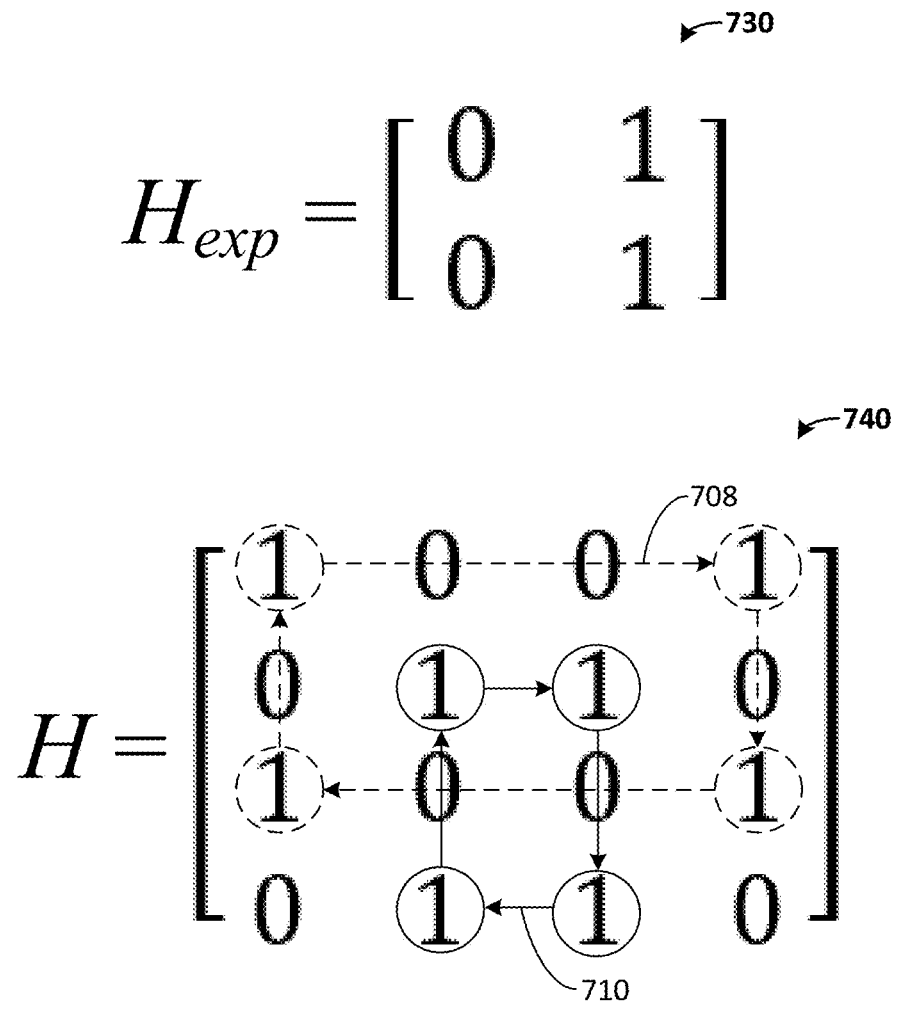

$$H = \begin{bmatrix} 1 & 0 & 0 & 1 \\ 0 & 1 & 1 & 0 \\ 1 & 0 & 0 & 1 \\ 0 & 1 & 1 & 0 \end{bmatrix} \quad \leftarrow 740$$

SYSTEMS AND METHODS FOR IRREGULAR ERROR CORRECTION CODE CONSTRUCTION IN ORDER OF WEIGHTS

TECHNICAL FIELD

The present disclosure is directed to systems and methods for constructing error correction codes.

SUMMARY

In accordance with the present disclosure, systems and methods are provided for performing in-order error correction code construction based on respective corresponding weights of multiple generated matrices. The system and methods disclosed herein enable in-order error correction code (e.g., low-density parity check (LDPC) codes) construction based on respective corresponding weights of multiple generated matrices. This in-order error correction code construction improves the error floor of the constructed error correction codes by reducing the number of incident cycles in the matrices used in error correction code construction, wherein the reduced incident cycles are of at most a predetermined length, which may cause error correction code failures.

A matrix which contains many incident cycles may cause an unexpected increase in the rate of error correction code failures, even when transmitting on a bus or channel with little noise, and therefore raise the error floor of the constructed error correction codes. In order to reduce the error floor of bit errors during error correction code construction, incident cycles of at most a predetermined length should be avoided or removed from matrices by matrix manipulation. In some embodiments, the predetermined length corresponds to a length of incident cycles that cause a greater rate of error correction code failures than lengths of which that are longer than the predetermined length. The in-order error correction code construction of the present disclosure is dependent on the predetermined length, such that incident cycles of at most the predetermined length are to be evaluated, and reduced or avoided.

In some embodiments, a system (e.g., a server device or storage device) is provided with a memory and processing circuitry that are communicatively coupled to each other. In some embodiments, the processing circuitry generates a first plurality of matrices based on a random number, where each matrix is of a predetermined size. In some embodiments, the processing circuitry generates a second plurality of matrices based on at least one additive candidate matrix and each respective matrix of the first plurality of matrices, wherein each respective matrix of the second plurality of matrices has a respective weight indicative of the extensibility of that respective matrix. Extensibility of a respective matrix may be defined as a characteristic indicative of a matrix's ability to be used for further iterations of in-order error correction code construction. In some embodiments, the processing circuitry then generates a third plurality of matrices based on at least one additive test matrix and each respective matrix of the second plurality of matrices. The processing circuitry then determines the weights of each respective matrix of the second plurality of matrices and selects at least one matrix based on the weight relative to other weights of the matrices of the second plurality of matrices. In some embodiments, the least one selected matrices from the second plurality of matrices become an updated first plurality of matrices for further in-order error correction code construction. In some embodiments, processing circuitry repeats this process for a predetermined number of iteration to select at least one selected matrix. Once the processing circuitry selects the at least one matrix, the processing circuitry generates an error correction code based on one of the at least one selected matrix. In some embodiments, the error correction codes (e.g., LDPC codes) are used to detect signal channel reliability issues.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, and/or characteristic included in at least one implementation. Thus, phrases such as "in one embodiment" or "in an alternate embodiment" appearing herein describe various embodiments and implementations, and do not necessarily all refer to the same embodiment. However, they are also not necessarily mutually exclusive.

FIGS. 7B and 7C each show an example set of an exponent matrix $H_{exp}$ and a corresponding matrix instantiation H for a respective matrix, in accordance with some embodiments of the present disclosure;

DETAILED DESCRIPTION

Figure 1:
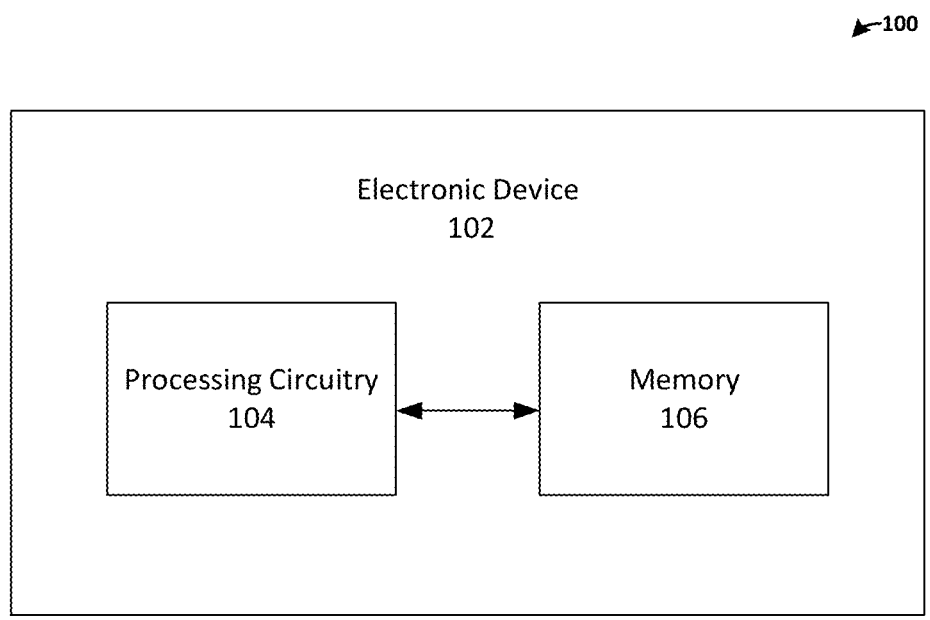
FIG. 1 shows an illustrative diagram of a system of an electronic device with a processing circuitry and memory, in accordance with some embodiments of the present disclosure.

In accordance with the present disclosure, systems and method are provided for performing in-order error correction code construction based on respective corresponding weights of multiple generated matrices. Error correction codes (e.g., low-density parity-check (LDPC) codes) are data signal schema that append redundant data to a signal. A receiver of the signal uses the redundant data to check consistency of the originally transmitted signal, and to recover or correct data that has been corrupted in transit. Generally, the redundant data includes parity or check bits, which are generated using an encoding algorithm and derived from the message data of the signal. A device (e.g., a storage device such as a solid-state device (SSD)) may use error correction codes to detect any irregularities that a signal may incur after transmitting over a network bus or channel. In some embodiments, the device may be any suitable device that transmits signals and may use error correction codes for improved reliability of the network bus, or the channel used by the device.

Error correction codes may be constructed by using randomly generated matrices. The generated matrices may be modified in order to remove irregularities such as incident cycles that corresponds to a respective matrix. In this process matrices may be evaluated for incident cycles by using the Fossorier Condition. In some embodiments, a Fossorier Condition may be used to evaluate incident cycles of a certain length (e.g., 4-cycle, 8-cycle, 12-cycle, etc.) for each instantiation of a respective matrix. An incident cycle may be represented by a sequence of nodes connected by edges in a Tanner graph corresponding to a respective matrix. A Tanner graph corresponding to a matrix instantiation includes nodes that are used to represent state constraints or equations for error correction codes. An edge may be defined as a connection between two nodes of the Tanner graph. The length of a respective incident cycle may be defined as the number of nodes in the sequence of nodes of the respective incident cycle. An incident cycle may be defined as a sequence of nodes, each respective node of the sequence of nodes connected to a respective subsequent node by a respective edge, wherein the sequence of nodes may be traversed along the edges of the sequence of nodes from a first node of the sequence to a last node of the sequence without repeating any of the previously traversed edges. The device disclosed herein may include processing circuitry which receives multiple matrices, where each matrix is of a predetermined size. In some embodiments, the processing circuitry generates each of the multiple matrices based on a random number. The processing circuitry generates and determines multiple pluralities of matrices in order to select a matrix with a maximum weight relative to other weights of the multiple matrices. Once the processing circuitry selects the matrix, the processing circuitry generates an error correction code based on the selected matrix.

For purposes of brevity and clarity, the features of the disclosure described herein are in the context of a device having processing circuitry and memory. However, the principles of the present disclosure may be applied to any other suitable context in which error correction code construction is performed. A device may include processing circuitry and memory, where the processing circuitry and memory are communicatively coupled by a network bus or interface. In some embodiments, the processing circuitry randomly generates multiple matrices and stores the multiple matrices in the memory.

In some embodiments, a processor of the processing circuitry may be a highly parallelized processor capable of handling high bandwidths of data quickly (e.g., by starting simultaneous in-order error correction code constructions).

In some embodiments the system and methods of the present disclosure may refer to an electronic device, which may be a storage device such as an SSD.

An SSD is a data storage device that uses integrated circuit assemblies as memory to store data persistently. SSDs have no moving mechanical components, and this feature distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency.

Many types of SSDs use NAND-based flash memory which retain data without power and include a type of non-volatile storage technology. Quality of Service (QOS) of an SSD may be related to the predictability of low latency and consistency of high input/output operations per second (IOPS) while servicing read/write input/output (I/O) workloads. This means that the latency or the I/O command completion time needs to be within a specified range without having unexpected outliers. Throughput or I/O rate may also need to be tightly regulated without causing sudden drops in performance level.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others.

The subject matter of this disclosure may be better understood by reference to FIGS. 1-10.

FIG. 1 shows an illustrative diagram of a system 100 of an electronic device 102 with a processing circuitry 104 and memory 106, in accordance with some embodiments of the present disclosure. In some embodiments, electronic device 102 may be a server device or a solid-state storage device (e.g., an SSD device). In some embodiments, processing circuitry 104 may include a processor or any suitable processing unit. In some embodiments, memory 106 may be non-volatile memory. It will be understood that the embodiments of the present disclosure are not limited to server device or SSDs. For example, in some embodiments, the electronic device 102 may include a hard disk drive (HDD) device in addition to or in place of an SSD. In some embodiments, electronic device 102 may be any suitable device (e.g., a host device), which transmits signals over a communication channel, bus, or interface and may use error correction codes in order to ensure signal reliability during for signal communications. In some embodiments, the electronic device 102 may be a server device to perform in-order error correction code construction and then transmit the error correction codes to another device, such as an SSD device to configure the SSD device. The SSD is then capable of applying the configuration to protect signals when the SSD device transmits signals when in operation.

In some embodiments, the processing circuitry 104 is communicatively coupled to memory 106. Processing circuitry 104 is configured to access data from memory 106 in order to perform in-order error correction code construction. In some embodiments, at least one matrix that may be used for in-order error correction code construction is stored in memory 106. In some embodiments, processing circuitry 104 may read matrix data from memory 106 or write matrix data to memory 106. There may also be a temporary memory (e.g., a cache or queue) disposed within the processing circuitry 104, the temporary memory configured to store any outstanding data (e.g., matrix data) that is to be processed by the processing circuitry 104.

Additionally, electronic device 102 includes memory 106. In some embodiments, memory 106 includes any one or more of a non-volatile memory, such as Phase Change Memory (PCM), a PCM and switch (PCMS), a Ferroelectric Random Access Memory (FeRAM), or a Ferroelectric Transistor Random Access Memory (FeTRAM), a Memristor, a Spin-Transfer Torque Random Access Memory (STT-RAM), and a Magnetoresistive Random Access Memory (MRAM), any other suitable memory, or any combination thereof. In some embodiments, memory 106 may also include spinning magnetic hard disk drives (HDDs). In some embodiments, memory 106 may also include any one or more of a volatile memory, such as dynamic random access memory (DRAM) and static random access memory (SRAM).

In some embodiments, a data bus interface is used to transport data associated with the in-order error correction code construction. The data bus between the memory 106 and processing circuitry 104 provides a network bus for accessing or writing of data to memory 106. In some embodiments, the processor or processing unit of processing circuitry 104 may include a hardware processor, a software processor (e.g., a processor emulated using a virtual machine), or any combination thereof. The processor, also referred to herein as processing circuitry 104, may include any suitable software, hardware, or both for controlling the memory 106 and the processing circuitry 104. In some embodiments, the electronic device 102 may further include a multi-core processor. Memory 106 may also include hardware elements for non-transitory storage of instructions, commands, or requests.

The processing circuitry 104 is configured to perform in-order error correction code construction based on weight values corresponding to a respective matrix from among multiple matrices. In some embodiments, processing circuitry 104 is configured to determine the respective weight of a respective matrix. In some embodiments, the processing circuitry 104 may evaluate the respective matrix multiple times by using a Fossorier Condition for incident cycles of different lengths (e.g., 4-cycle, 8-cycle, 12-cycle, etc.). The Fossorier Condition is a theorem used to determine the incident cycles of a certain length in a corresponding Tanner graph of a respective matrix. In some embodiments, a Tanner graph corresponding to a respective matrix includes nodes that are used to represent state constraints or equations for error correction codes. In some embodiments, an incident cycle may be determined within a Tanner graph including multiple nodes, generated by the processing circuitry 104. An incident cycle may be defined as a sequence of nodes, each respective node of the sequence of nodes connected to a respective subsequent node by a respective edge, wherein the sequence of nodes may be traversed along the edges of the sequence of nodes from a first node of the sequence to a last node of the sequence without repeating any of the previously traversed edges. The in-order error correction code construction will ensure that the processing circuitry 104 constructs error correction codes (e.g., low-density parity check (LDPC) codes) based on respective corresponding weights of multiple generated matrices. Each instantiation may be used to generate another error correction code. This in-order error correction code construction, when completed by processing circuitry 104, improves the error floor of the constructed error correction codes by reducing the number of incident cycles of at most the predetermined length in matrices that are used in error correction code construction, such that the reduced incident cycles of at most the predetermined length may cause error correction code failures.

Storage devices (for example, SSD devices) may include one or more packages of memory dies (i.e., memory 106), where each die includes storage cells. In some embodiments, the storage cells are organized into pages, and pages are organized into blocks. Each storage cell can store one or more bits of information.

It will be understood that, while system 100 depicts an embodiment in which an electronic device 102 is configured to have capabilities for performing in-order error correction code construction based on respective corresponding weights of multiple generated matrices in accordance with the present disclosure, any other suitable device may be implemented in a similar manner.

For purposes of clarity and brevity, and not by way of limitation, the present disclosure is provided in the context of performing in-order error correction code construction based on respective corresponding weights of multiple generated matrices, which provides the features and functionalities disclosed herein. The process of in-order error correction code construction may be configured by any suitable software, hardware, or both for implementing such features and functionalities. In-order error correction code construction based on respective corresponding weights of multiple generated matrices may be at least partially implemented in, for example, electronic device 102 (e.g., as part of processing circuitry 104, or any other suitable device). For example, for an electronic device (i.e., electronic device 102), in-order error correction code construction based on respective corresponding weights of multiple generated matrices may be implemented in processing circuitry 104.

Figure 2:
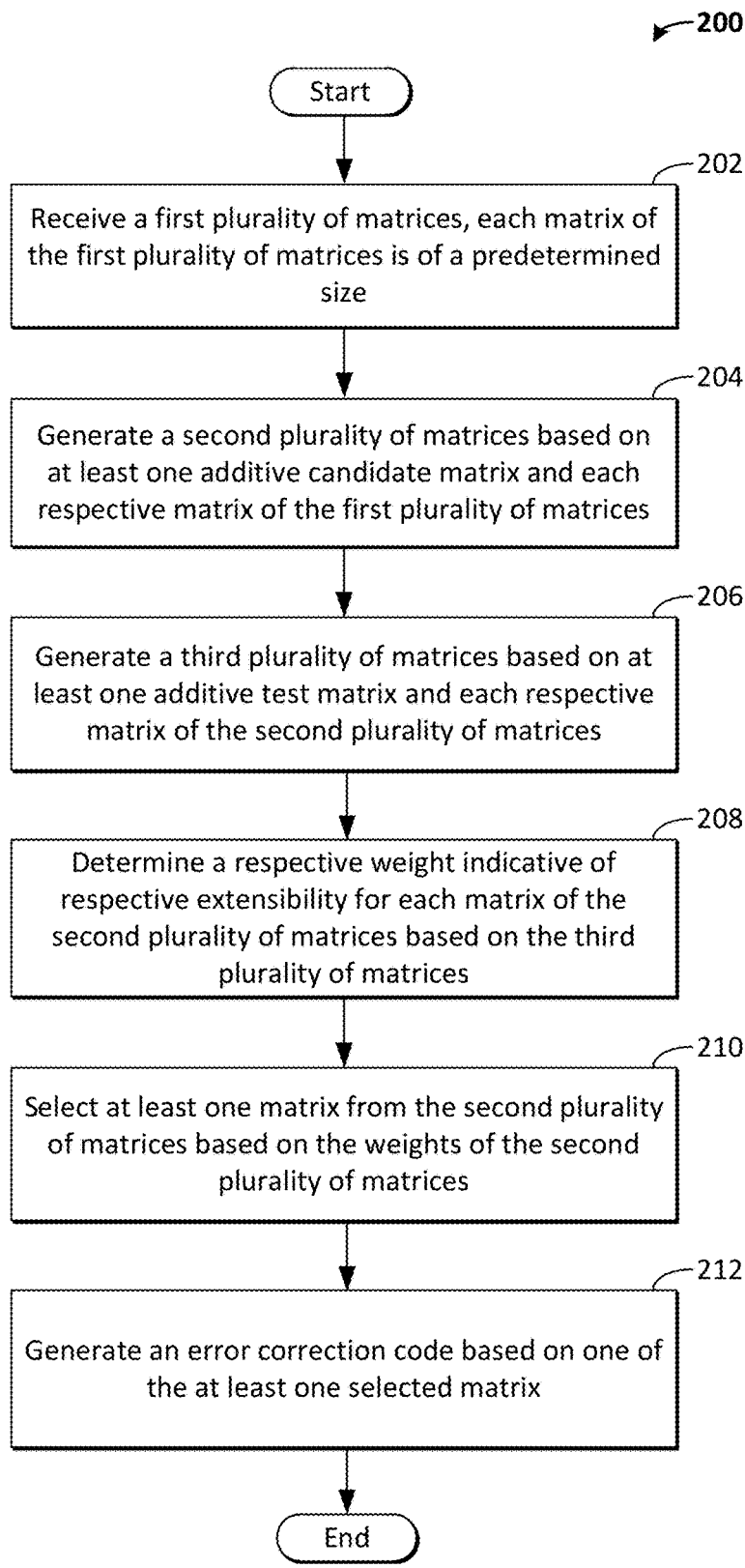
FIG. 2 shows a flowchart of illustrative steps for generating error correction code with in-order code construction, in accordance with some embodiments of the present disclosure.

FIG. 2 shows a flowchart 200 of illustrative steps for generating error correction code with in-order code construction, in accordance with some embodiments of the present disclosure. In some embodiments, the referenced processing circuitry may be implemented as processing circuitry 104. In some embodiments, the process 200 can be modified by, for example, having steps rearranged, changed, added, and/or removed.

At step 202, the processing circuitry receives a first plurality of matrices. In some embodiments, the processing circuitry generates the first plurality of matrices based on a random number, wherein the random number is randomly generated by the processing circuitry. In some embodiments, the processing circuitry includes a random number generator. Each matrix of the received first plurality of matrices may be of a predetermined size, where the predetermined size may be determined by a random number or may be configured based on a configurable parameter.

At step 204, the processing circuitry generates a second plurality of matrices based on at least one additive candidate matrix and each respective matrix of the first plurality of matrices. In some embodiments, the processing circuitry generates each matrix of the second plurality of matrices based on one matrix from the first plurality of matrices and one additive candidate matrix, for each additive candidate matrix of the at least one additive candidate matrix. In some embodiments, each additive candidate matrix is of a number of rows which is the same as a number of rows of each matrix of the first plurality of matrices. In some embodiments, the number of columns in each additive candidate matrix is smaller than the number of columns of each matrix of the first plurality of matrices.

At step 206, the processing circuitry generates a third plurality of matrices based on at least one additive test matrix and each respective matrix of the second plurality of matrices. In some embodiments, the processing circuitry generates each matrix of the third plurality of matrices based on one matrix from the second plurality of matrices and one additive test matrix, for each additive test matrix of the at least one additive test matrix. In some embodiments, each additive test matrix is of a number of rows which is the same as a number of rows of each matrix of the second plurality of matrices. Each additive test matrix is also of a number of columns which is less than a number of columns of each matrix of the second plurality of matrices. In some embodiments, a respective additive test matrix replaces a portion of a respective matrix of the second plurality of matrices, for each additive test matrix, to form each matrix of the third plurality of matrices. In some embodiments, the third plurality of matrices are generated by appending a respective additive test matrix onto a respective matrix of the second plurality of matrices, for each additive test matrix, in order to then determine each respective weight of a respective matrix of the second plurality of matrices, shown at step 208.

At step 208, the processing circuitry determines a respective weight indicative of respective extensibility for each matrix of the second plurality of matrices based on the third plurality of matrices. In some embodiments, the processing circuitry calculates a respective number of incident cycles of at most a predetermined length for each respective matrix of the third plurality of matrices. In some embodiments, the weight of each respective matrix of the second plurality of matrices is determined by the processing circuitry based on the respective calculated number of incident cycles of at most the predetermined length for each matrix of the third plurality of matrices. In some embodiments, the processing circuitry calculates the number of incident cycles of a respective matrix of the third plurality of matrices by generating a Tanner Graph that corresponds to the respective matrix and determines the number of incident cycles of at most the predetermined length in the generated Tanner graph. In some embodiments, the weight of a respective matrix of the second plurality of matrices is calculated as the number of matrices in the third plurality of matrices generated based on the respective matrix that has the minimum number of incident cycles as the respective matrix from the second plurality of matrices. In some embodiments, the weight of a respective matrix of the second plurality of matrices is calculated as −1 multiplied by the total number of incident cycles in each the third plurality of matrices generated based on the respective matrix. In some embodiments, the processing circuitry determines the weights of a predetermined number of matrices, before continuing to step 210 of process 200.

At step 210, the processing circuitry selects at least one matrix from the second plurality of matrices based on the weights of the second plurality of matrices. In some embodiments, the selected at least one matrix has a maximum weight relative to other weights of the second plurality of matrices. In some embodiments, a respective matrix of the second plurality of matrices with the fewest calculated number of incident cycles of at most the predetermined length for each matrix of the third plurality of matrices generated based on the respective matrix would be selected first in order to prioritize error code construction with matrices that are highly extensible. By selecting matrices that construct reliable error correction codes, this process reduces the likelihood of errors in the construction of error correction code, which reduces the overall error floor for error correction code construction. In some embodiments, processing circuitry replaces the first plurality of matrices received at step 202 with the at least one selected matrix for any further in-order error correction code construction.

At step 212, the processing circuitry generates an error correction code based on one of the at least one selected matrix. In some embodiments, the error correction code generated is any one of a low-density parity check (LDPC) code or any other suitable quasi-cyclic error correction code. In some embodiments, each selected matrix of the at least one selected matrix may generate a corresponding error correction code. In some embodiments, a selected matrix used to generate a respective error correction code is used as the parity-check matrix for the respective generated error correction code.

Figure 3:
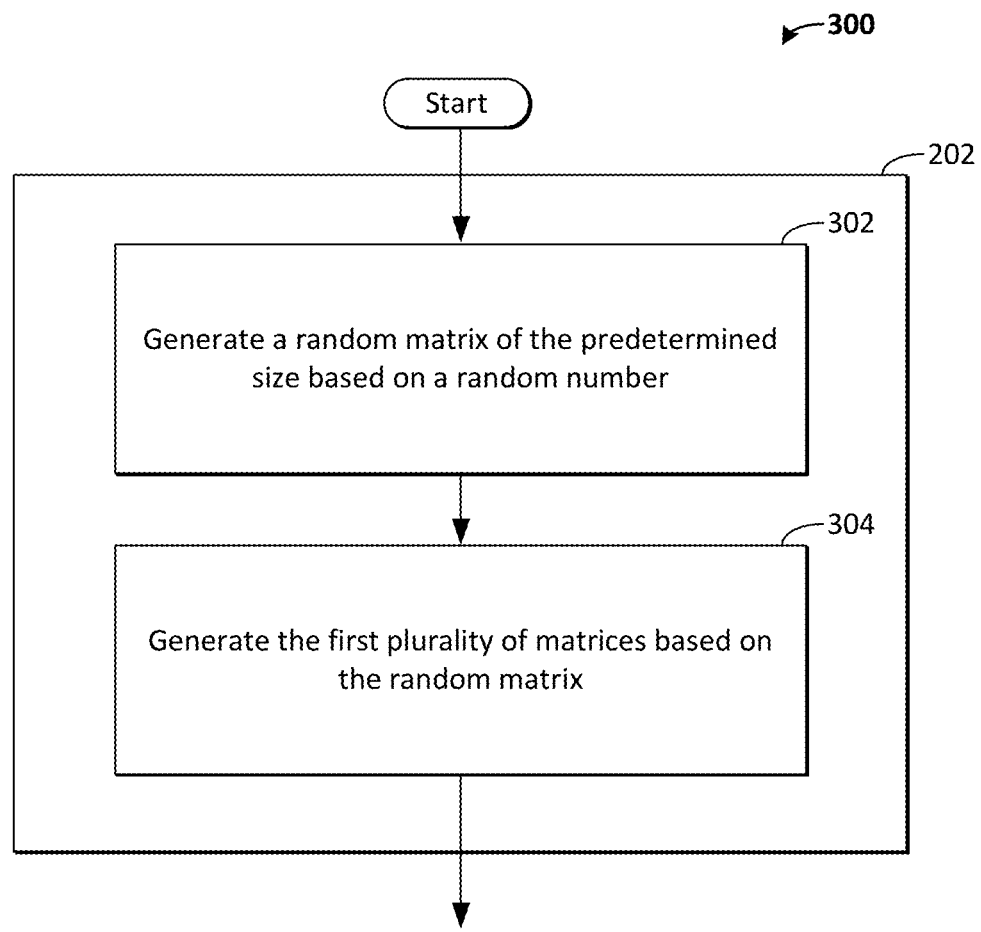
FIG. 3 shows a flowchart of illustrative steps of a subprocess for generating a first plurality of matrices, in accordance with some embodiments of the present disclosure.

FIG. 3 shows a flowchart of illustrative steps of a sub-process 300 for generating a first plurality of matrices, in accordance with some embodiments of the present disclosure. In some embodiments, the referenced processing circuitry may be implemented as processing circuitry 104. In some embodiments, the subprocess 300 can be modified by, for example, having steps rearranged, changed, added, and/or removed. In some embodiments, subprocess 300 may correspond to step 202 shown in FIG. 2.

At step 302, the processing circuitry generates a random matrix of predetermined size based on a random number. In some embodiments, the processing circuitry generates a random matrix by using a random matrix generator. The random matrix generator constructs a random matrix of the predetermined size for error correction code construction.

At step 304, the processing circuitry generates the first plurality of matrices based on the random matrix. In some embodiments, once the random matrix is generated, at step 302, the processing circuitry may generate multiple other random matrices of the same predetermine size.

Figure 4:
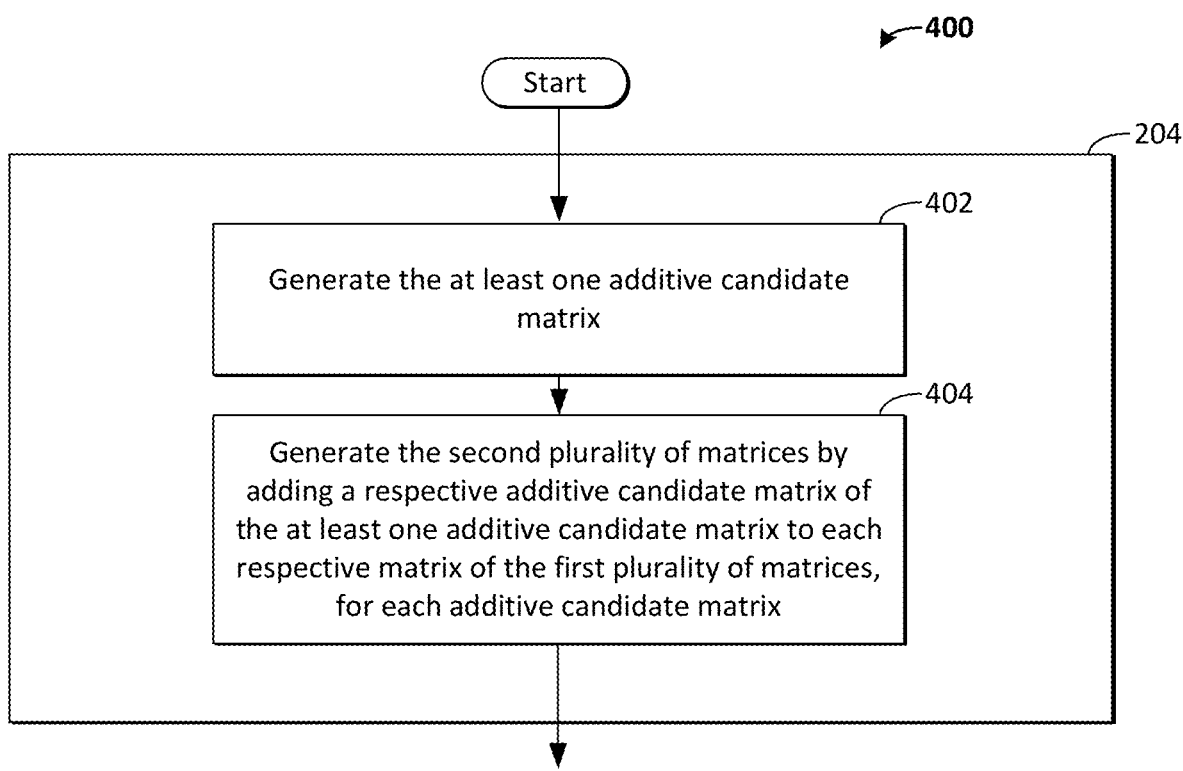
FIG. 4 shows a flowchart of illustrative steps of a subprocess for generating a second plurality of matrices based on at least one additive candidate matrix and each respective matrix of the first plurality of matrices, in accordance with some embodiments of the present disclosure.

FIG. 4 shows a flowchart of illustrative steps of a subprocess 400 for generating a second plurality of matrices based on at least one additive candidate matrix and each respective matrix of the first plurality of matrices. In some embodiments, the referenced processing circuitry may be implemented as processing circuitry 104. In some embodiments, the subprocess 400 can be modified by, for example, having steps rearranged, changed, added, and/or removed. In some embodiments, subprocess 400 may correspond to step 204 shown in FIG. 2.

At step 402, the processing circuitry generates the at least one additive candidate matrix. In some embodiments, each additive candidate matrix is of a number of rows which is the same as a number of rows of each matrix of the first plurality of matrices. In some embodiments, the number of columns in each additive candidate matrix is smaller than the number of columns of each respective matrix of the first plurality of matrices.

At step 404, the processing circuitry generates the second plurality of matrices by adding a respective additive candidate matrix of the at least one additive candidate matrix to each respective matrix of the first plurality of matrices, for each additive candidate matrix. In some embodiments, a respective additive candidate matrix replaces a portion of a respective matrix of the first plurality of matrix to form a respective matrix of the second plurality of matrices. In some embodiments, each matrix of the second plurality of matrices has a respective weight indicative of respective extensibility when generating error correction codes.

Figure 5:
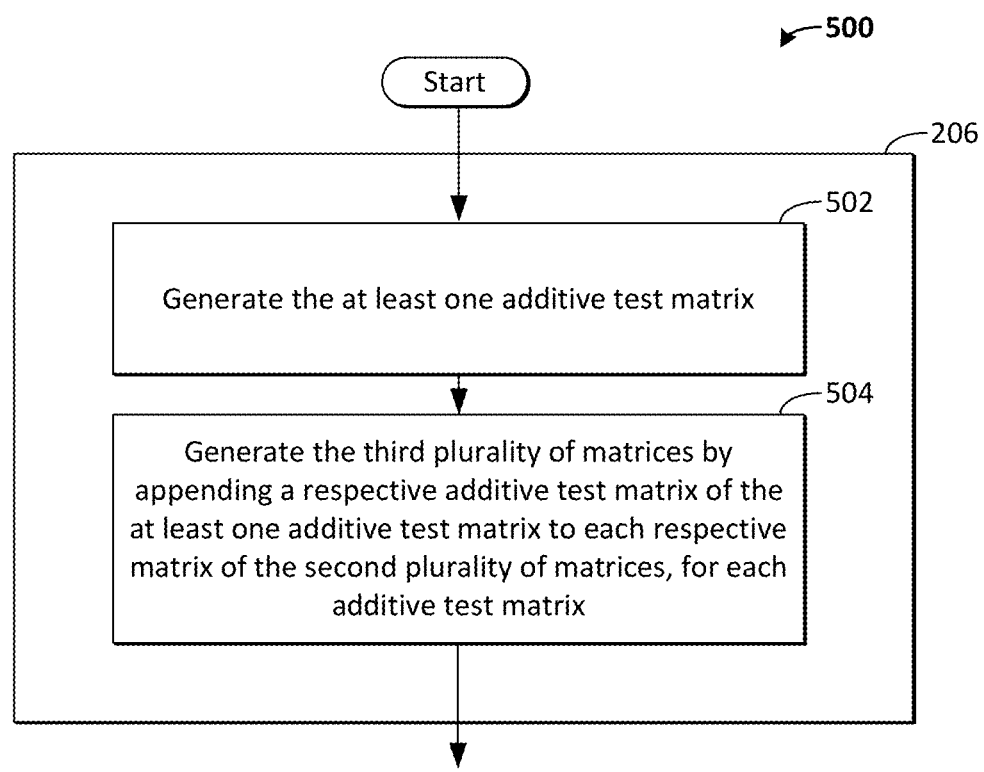
FIG. 5 shows a flowchart of illustrative steps of a subprocess for generating a third plurality of matrices based on at least one additive test matrix and each respective matrix of the second plurality of matrices, in accordance with some embodiments of the present disclosure.

FIG. 5 shows a flowchart of illustrative steps of a subprocess 500 for generating a third plurality of matrices based on at least one additive test matrix and each respective matrix of the second plurality of matrices, in accordance with some embodiments of the present disclosure. In some embodiments, the referenced processing circuitry may be implemented as processing circuitry 104. In some embodiments, the subprocess 500 can be modified by, for example, having steps rearranged, changed, added, and/or removed. In some embodiments, subprocess 500 may correspond to step 206 shown in FIG. 2.

At step 502, the processing circuitry generates the at least one additive test matrix. In some embodiments, each additive test matrix is of a number of rows which is the same as a number of rows of each matrix of the second plurality of matrices. In some embodiments, the number of columns in each additive candidate matrix is smaller than the number of columns of each matrix of the second plurality of matrices. In some embodiments, the at least one additive test matrix includes a fixed set of additive test matrices to be appended to each matrix of the second plurality of matrices to form some of the matrices of the third plurality of matrices based on the second plurality of matrices. In other embodiments, the at least one additive test matrix includes a fixed set of additive test matrices to replace a portion of each matrix of the second plurality of matrices to form some of the matrices of the third plurality of matrices based on the second plurality of matrices.

At step 504, the processing circuitry generates the third plurality of matrices by appending a respective additive test matrix of the at least one additive test matrix to each respective matrix of the second plurality of matrices, for each additive test matrix. In some embodiments, the processing circuitry generates the third plurality of matrices by replacing a portion of each respective matrix of the second plurality of matrices with a respective additive test matrix of the at least one additive test matrix, for each additive test matrix. Therefore, for each respective matrix of the second plurality of matrices, there is a respective subset of matrices of the third plurality of matrices generated based on the respective matrix of the second plurality of matrices. This respective subset is used in order to determine the respective weight indicative of extensibility of the respective matrix of the second plurality of matrices, as shown in FIG. 6.

Figure 6:
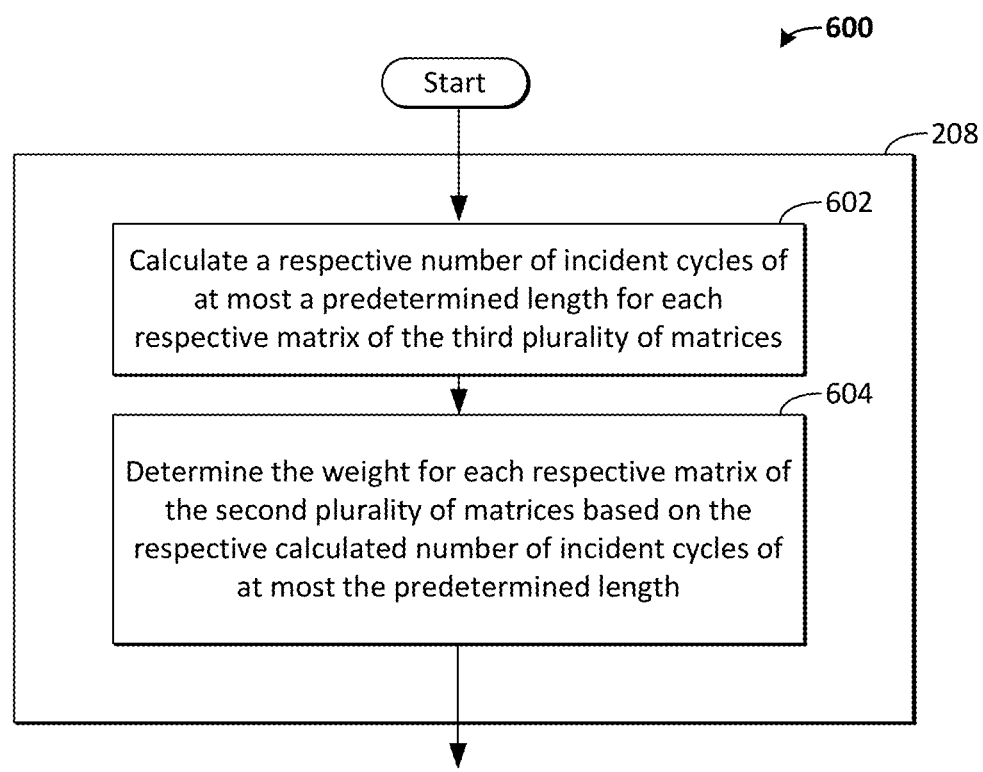
FIG. 6 shows a flowchart of illustrative steps of a subprocess for determining a respective weight indicative of respective extensibility for each matrix of the second plurality of matrices based on the third plurality of matrices, in accordance with some embodiments of the present disclosure.

FIG. 6 shows a flowchart of illustrative steps of a subprocess 600 for determining a respective weight indicative of respective extensibility for each matrix of the second plurality of matrices based on the third plurality of matrices, in accordance with some embodiments of the present disclosure. In some embodiments, the referenced processing circuitry may be implemented as processing circuitry 104. In some embodiments, the subprocess 600 can be modified by, for example, having steps rearranged, changed, added, and/or removed. In some embodiments, subprocess 600 may correspond to step 208 shown in FIG. 2.

At step 602, the processing circuitry calculates a respective number of incident cycles of at most a predetermined length for each respective matrix of the third plurality of matrices. In some embodiments, the processing circuitry calculates the number of incident cycles of a respective matrix of the third plurality of matrices by generating a Tanner Graph that corresponds to the respective matrix and determines the number of incident cycles of at most the predetermined length in the generated Tanner graph. In some embodiments, the Fossorier Condition is used to check for incident cycles of different lengths (e.g., 4-cycle, 8-cycle, 12-cycle, etc.).

At step 604, the processing circuitry determines the weight for each respective matrix of the second plurality of matrices based on the respective calculated number of incident cycles of at most the predetermined length. The weight for each respective matrix of the second plurality of matrices based on the respective subset of matrices of the third plurality of matrices generated based on the respective matrix of the second plurality of matrices. In some embodiments, the weight of a respective matrix of the second plurality of matrices is calculated based on the number of matrices in the third plurality of matrices generated based on the respective matrix which have a minimum number of incident cycles of the predetermined length, the minimum number of incident cycles defined by the number of incident cycles of the predetermined length evaluated in the respective matrix from the second plurality of matrices. In some embodiments, the weight of a respective matrix of the second plurality of matrices is calculated as −1 multiplied by the total number of incident cycles in of the third plurality of matrices generated based on the respective matrix.

Figure 7A:
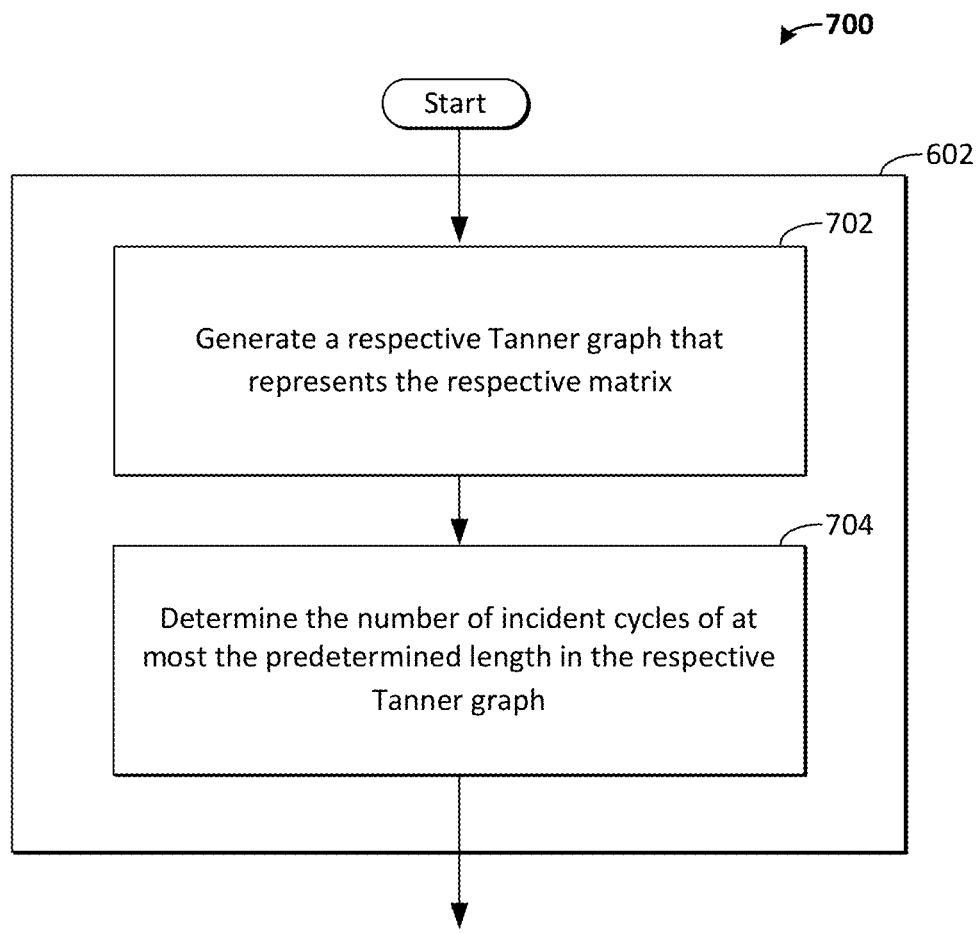
FIG. 7A shows a flowchart of illustrative steps of a subprocess for calculating a respective number of incident cycles of at most a predetermined length for each respective matrix of the third plurality of matrices, in accordance with some embodiments of the present disclosure.

FIG. 7A shows a flowchart of illustrative steps of a subprocess 700 for calculating a respective number of incident cycles of at most a predetermined length for each respective matrix of the third plurality of matrices, in accordance with some embodiments of the present disclosure. In some embodiments, the referenced processing circuitry may be implemented as processing circuitry 104. In some embodiments, the subprocess 700 can be modified by, for example, having steps rearranged, changed, added, and/or removed. In some embodiments, subprocess 700 may correspond to step 602 shown in FIG. 6.

At step 702, the processing circuitry generates a respective Tanner graph that represents the respective matrix. In some embodiments, the processing circuitry generates a Tanner graph that represents a respective matrix of the third plurality of matrices. In some embodiments, a Tanner graph corresponding to a matrix includes nodes that are used to represent state constraints or equations for error correction codes. In some embodiments, the processing circuitry then determines the number of incident cycles of at most the predetermined length in the Tanner graph that represents of the matrix. An incident cycle may be defined as a sequence of nodes, each respective node of the sequence of nodes connected to a respective subsequent node by a respective edge, wherein the sequence of nodes may be traversed along the edges of the sequence of nodes from a first node of the sequence to a last node of the sequence without repeating any of the previously traversed edges. An incident cycle may be represented by a sequence of nodes connected by edges in the Tanner graph corresponding to the respective matrix.

At step 704, the processing circuitry determines the number of incident cycles of at most the predetermined length in the respective Tanner graph. In some embodiments, the processing circuitry evaluates the Tanner graph for incident cycles of at most a predetermined length by using a Fossorier Condition. The Fossorier Condition is a theorem used to determine the incident cycles of a certain length in a corresponding Tanner graph of the matrix. The matrices of the third plurality of matrices which do not contain any or a reduced number of incident cycles of at most the predetermined length may cause error correction code failures at a lower rate than other matrices which have a greater number of incident cycles of the predetermined length. With an increasing number of incident cycles determined in the Tanner graph there may be a number of incident cycles of at most a predetermined length which renders the matrix to be less favorable for the use of in-order error correction code construction. A matrix with many incident cycles of at most the predetermined length may cause error correction code failures at a greater rate than matrices with fewer or no incident cycles of at most the predetermined length.

FIGS. 7B and 7C each show an example set of an exponent matrix $H_{exp}$ (e.g., 710 and 730) and a corresponding matrix H (e.g., 720 and 740) of the third plurality of matrices based on a respective matrix of the second plurality of matrices, in accordance with some embodiments of the present disclosure. In some embodiments, the corresponding matrix H (e.g., 720 and 740) may be referred to as a respective expanded exponent matrices of a respective exponent matrix. Matrix 720 shows an incident cycle with a length of 8 edges, also known as 8-cycle 706. Matrix 740 shows 4-cycles 708, 710.

The respective exponent matrices 710, 730 correspond to the respective matrix 720, 740 such that each exponent in each respective exponent matrix 710, 730 corresponds to a Q×Q portion of multiple non-overlapping Q×Q portions within each respective matrix 720, 740, where in this case Q=2. In such example sets, the possible exponents for each 2×2 portion is either zero or one, wherein an exponent value of zero corresponds to a 2×2 identity matrix and an exponent value of one corresponds to a once-right-shifted 2×2 identity matrix.

As discussed at step 704, the processing circuitry determines for incident cycles of at most a predetermined length by using a Fossorier Condition for matrices of the third plurality of matrices (e.g., matrices 720, 740). In some embodiments, the exponent matrix is of size Q (e.g., a Q×Q matrix). The Fossorier Condition may be used to evaluate for incident cycles of a certain length within an exponent matrix (e.g., 710, 730). Multiple Fossorier Conditions may be used to evaluate for incident cycles of various lengths (e.g., 4-cycle, 8-cycle, 12-cycle, etc.). A Fossorier Condition to evaluate for an incident cycle of length N, or an N-cycle, may be defined as when a summation of the differences in the row of exponents within the exponent matrix (e.g., 710, 730) is equal to zero modulo-Q, there is an incident cycle of 2Q. For example, exponent matrix 510 is an exponent matrix where Q=2, and in order to determine whether a 4-cycle (e.g., N=4) is present in matrix 720, the Fossorier Condition is as shown:

$$0 \bmod Q = 0 \bmod 2\underline{?}(0-1) + (0-0)$$

$$0 \neq -1$$

This inequality indicates that the matrix 720 which corresponds to exponent matrix 710 does not include any 4-cycles. The only incident cycle that matrix 720 may be illustrated as 8-cycle 706, which can be met with Fossorier Condition evaluation for 8-cycles as shown:

$$0 \bmod Q = 0 \bmod 2\underline{?}(0-1) + (0-0) + (0-1) + (0-0)$$

$$0 = -2 \bmod 2$$

$$0 = 0$$

Now in another possible exponent matrix 730, an exponent corresponding to a particular 2×2 portion may change to another possible exponent based on another additive test matrix in order to evaluate the corresponding matrix 740 for 4-cycles. In such an example, the Fossorier Condition for 4-cycles is as shown:

$$0 \bmod Q = 0 \bmod 2\underline{?}(0-1) + (1-0)$$

$$0 = 0$$

The Fossorier Condition indicates that matrix 740 includes at least one 4-cycle. A first 4-cycle 708 and a second 4-cycle 710 of matrix instantiation 740 are illustrated in FIG. 7C. The Fossorier Condition may quickly evaluate multiple matrices of the third plurality of matrices (e.g., 720, 740) corresponding to exponent matrices (e.g., 710, 730) for incident cycles by using only an exponent matrix based on the additive test matrices.

Figure 8:
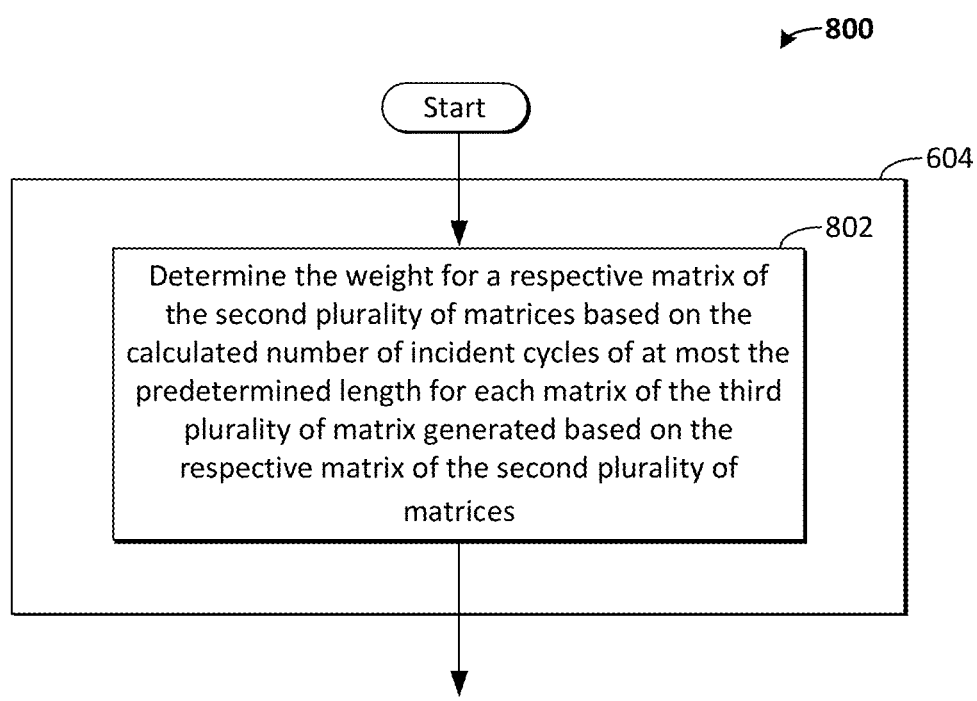
FIG. 8 shows another flowchart of illustrative steps of a subprocess for determining the weight for each respective matrix of the second plurality of matrices based on the respective calculated number of incident cycles of at most the predetermined length, in accordance with some embodiments of the present disclosure.

FIG. 8 shows another flowchart of illustrative steps of a subprocess 800 for determining the weight for each respective matrix of the second plurality of matrices based on the respective calculated number of incident cycles of at most the predetermined length, in accordance with some embodiments of the present disclosure. In some embodiments, the referenced processing circuitry may be implemented as processing circuitry 104. In some embodiments, the subprocess 800 can be modified by, for example, having steps rearranged, changed, added, and/or removed. In some embodiments, subprocess 800 may correspond to step 604 shown in FIG. 6.

At step 802, the processing circuitry determines the weight for a respective matrix of the second plurality of matrices based on the calculated number of incident cycles of at most the predetermined length for each matrix of the third plurality of matrix generated based on the respective matrix of the second plurality of matrices. In some embodiments, the processing circuitry determines the respective weight of the respective matrix of the second plurality of matrices in order to determine which matrices of the second plurality of matrices are less likely to generate bit errors for the error correction codes. This also ensures that the instantiation of the matrix used is reliable for in-order error correction code construction. In some embodiments, the weight of a respective matrix of the second plurality of matrices is calculated based on the number of matrices in the third plurality of matrices generated based on the respective matrix which have a minimum number of incident cycles of the predetermined length, the minimum number of incident cycles defined by the number of incident cycles of the predetermined length evaluated in the respective matrix from the second plurality of matrices. In some embodiments, the weight of a respective matrix of the second plurality of matrices is calculated as −1 multiplied by the total number of incident cycles in of the third plurality of matrices generated based on the respective matrix.

Figure 9:
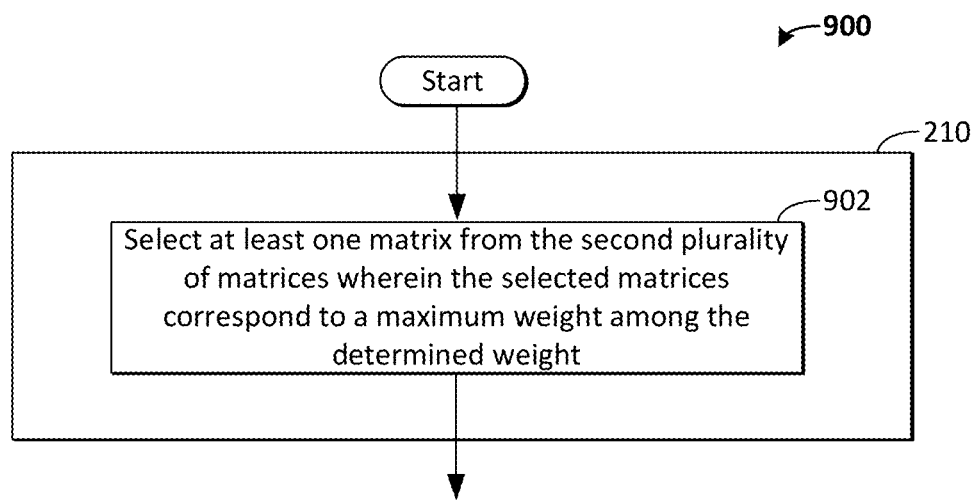
FIG. 9 shows another flowchart of illustrative steps of a subprocess for selecting at least one matrix from the second plurality of matrices based on the weights of the second plurality of matrices, in accordance with some embodiments of the present disclosure.

FIG. 9 shows another flowchart of illustrative steps of a subprocess 900 for selecting at least one matrix from the second plurality of matrices based on the weights of the second plurality of matrices, in accordance with some embodiments of the present disclosure. In some embodiments, the referenced processing circuitry may be implemented as processing circuitry 104. In some embodiments, the subprocess 900 can be modified by, for example, having steps rearranged, changed, added, and/or removed. In some embodiments, subprocess 900 may correspond to step 210 shown in FIG. 2.

At step 902, the processing circuitry selects at least one matrix from the second plurality of matrices wherein the selected matrices correspond to a maximum weight among the determined weight. In some embodiments, the processing circuitry selects the instantiation that corresponds to a Tanner graph with the fewest number of incident cycles in order to avoid bit errors in the constructed error correction codes.

Figure 10:
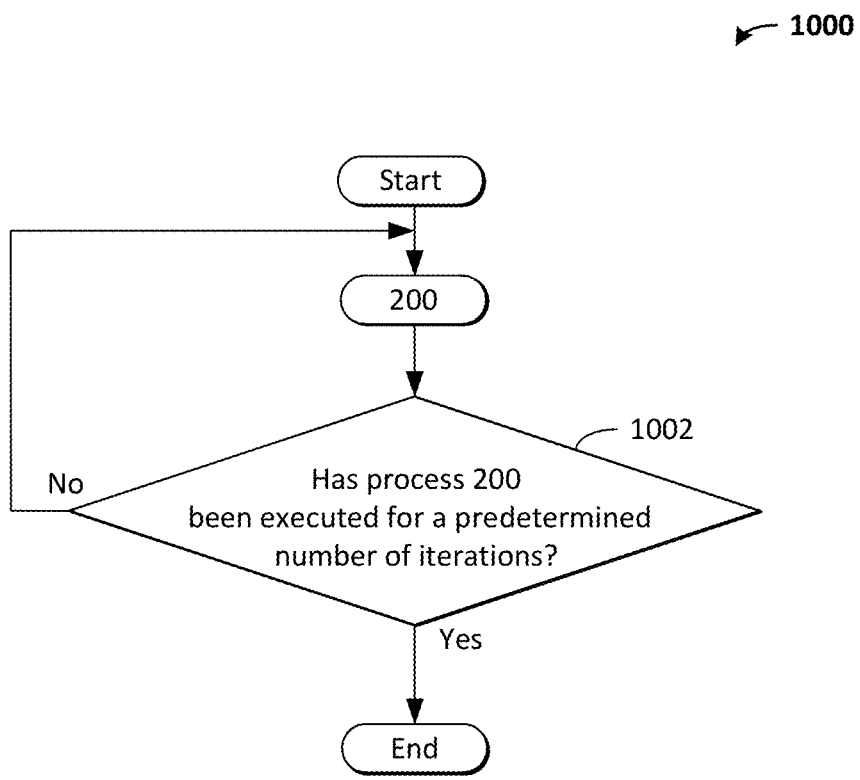
FIG. 10 shows a flowchart of illustrative steps for repeatedly generating error correction code matrices with in-order code construction, in accordance with some embodiments of the present disclosure.

FIG. 10 shows a flowchart 1000 of illustrative steps for repeatedly generating error correction code with in-order code construction, in accordance with some embodiments of the present disclosure. In some embodiments, the referenced processing circuitry may be implemented as processing circuitry 104. In some embodiments, the process 1000 can be modified by, for example, having steps rearranged, changed, added, and/or removed.

At step 1002, the processing circuitry determines if process 200 has been executed for a predetermined number of iterations. The predetermined number of iterations may be configured or set by the processing circuitry prior to executing process 1000. If process 200 has not been executed for a predetermined number of iterations, the processing circuitry repeats process 1000, by returning to process 200. When process 200 has been executed for the predetermined number of iterations, process 1000 is terminated.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods, and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified, or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of Random Access Memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the electronic devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

What is claimed is:

1. A method, comprising:
   (a) receiving, using processing circuitry, a first plurality of matrices;
   (b) generating, using the processing circuitry, a second plurality of matrices based on at least one additive candidate matrix and each respective matrix of the first plurality of matrices;
   (c) generating, using the processing circuitry, a third plurality of matrices based on at least one additive test matrix and each respective matrix of the second plurality of matrices;
   (d) determining a respective weight indicative of respective extensibility for each matrix of the second plurality of matrices based on the third plurality of matrices;
   (e) selecting, using the processing circuitry, at least one matrix from the second plurality of matrices based on the weights of the second plurality of matrices;
   (f) generating, using the processing circuitry, an error correction code based on one of the at least one selected matrix; and
   (g) performing, using the processing circuitry, an error correction operation on a signal based on the error correction code.

2. The method of claim 1, wherein generating the second plurality of matrices based on at least one additive candidate matrix and each respective matrix of the first plurality of matrices comprises:
   generating the at least one additive candidate matrix; and
   generating the second plurality of matrices by adding a respective additive candidate matrix of the at least one additive candidate matrix to each respective matrix of the first plurality of matrices, for each additive candidate matrix.

3. The method of claim 1, wherein generating a third plurality of matrices based on at least one additive test matrix and each respective matrix of the second plurality of matrices comprises:
   generating the at least one additive test matrix, each additive test matrix comprising:
      a number of rows, which corresponds to a number of rows of each matrix of the first plurality of matrices; and
      a number of columns, which is smaller than a number of columns of each matrix of the first plurality of matrices.

4. The method of claim 1, wherein generating a third plurality of matrices based on at least one additive test matrix and each respective matrix of the second plurality of matrices comprises:
   generating the third plurality of matrices by appending a respective additive test matrix of the at least one additive test matrix to each respective matrix of the second plurality of matrices, for each additive test matrix.

5. The method of claim 1, wherein generating a third plurality of matrices based on at least one additive test matrix and each respective matrix of the second plurality of matrices comprises:
   generating the third plurality of matrices by replacing a portion of each respective matrix of the second plurality of matrices with a respective additive test matrix, for each additive test matrix.

6. The method of claim 1, wherein determining a respective weight indicative of respective extensibility for each matrix of the second plurality of matrices based on the third plurality of matrices comprises:
   calculating a respective number of incident cycles of at most a predetermined length for each respective matrix of the third plurality of matrices; and
   determining the weight for each respective matrix of the second plurality of matrices based on the respective calculated number of incident cycles of at most the predetermined length.

7. The method of claim 6, wherein calculating a respective number of incident cycles of at most a predetermined length for each respective matrix of the third plurality of matrices comprises:
   generating a respective Tanner graph that represents the respective matrix; and
   determining the number of incident cycles of at most the predetermined length in the respective Tanner graph.

8. The method of claim 7, wherein determining the number of incident cycles of at most the predetermined length in the respective Tanner graph comprises evaluating for incident cycles of at most the predetermined length by using a Fossorier Condition for the respective Tanner Graph.

9. The method of claim 6, wherein determining the weight for each respective matrix of the second plurality of matrices based on the respective calculated number of incident cycles of at most the predetermined length comprises:
   determining the weight for a respective matrix of the second plurality of matrices based on the calculated number of incident cycles of at most the predetermined length for each matrix of the third plurality of matrix generated based on the respective matrix of the second plurality of matrices.

10. The method of claim 1, wherein selecting at least one matrix from the second plurality of matrices based on the weights of the second plurality of matrices comprises selecting at least one matrix from the second plurality of matrices wherein the selected matrices correspond to a maximum weight among the determined weights.

11. The method of claim 1, further comprising repeating (a)-(f) for a predetermined number of iterations.

12. A non-transitory computer-readable medium for storing non-transitory computer-readable instructions that, when executed by processing circuitry, cause the processing circuitry to:
   (a) receive a first plurality of matrices;
   (b) generate a second plurality of matrices based on at least one additive candidate matrix and each respective matrix of the first plurality of matrices;
   (c) generate a third plurality of matrices based on at least one additive test matrix and each respective matrix of the second plurality of matrices;
   (d) determine a respective weight indicative of respective extensibility for each matrix of the second plurality of matrices based on the third plurality of matrices;
   (e) select at least one matrix from the second plurality of matrices based on the weights of the second plurality of matrices;
   (f) generate an error correction code based on one of the at least one selected matrix; and
   (g) perform an error correction operation on a signal based on the error correction code.

13. The non-transitory computer-readable medium of claim 12, wherein to generate the second plurality of matrices based on at least one additive candidate matrix and each respective matrix of the first plurality of matrices the processing circuitry is to:
   generate the at least one additive candidate matrices; and
   generate the second plurality of matrices by adding a respective additive candidate matrix of the at least one additive candidate matrix to each respective matrix of the first plurality of matrices, for each additive candidate matrix.

14. The non-transitory computer-readable medium of claim 12, wherein to generate a third plurality of matrices based on at least one additive test matrix and each respective matrix of the second plurality of matrices the processing circuitry is to:
   generate the at least one additive test matrices, each additive test matrix comprising:
      a number of rows, which corresponds to a number of rows of each matrix of the first plurality of matrices; and
      a number of columns, which is smaller than a number of columns of each matrix of the first plurality of matrices.

15. The non-transitory computer-readable medium of claim 12, wherein to generate a third plurality of matrices based on at least one additive test matrix and each respective matrix of the second plurality of matrices the processing circuitry is to:
   generate the third plurality of matrices by appending a respective additive test matrix of the at least one additive test matrix to each respective matrix of the second plurality of matrices, for each additive test matrix.

16. The non-transitory computer-readable medium of claim 12, wherein to generate a third plurality of matrices based on at least one additive test matrix and each respective matrix of the second plurality of matrices the processing circuitry is to:
   generate the third plurality of matrices by replacing a portion of each respective matrix of the second plurality of matrices with a respective additive test matrix, for each additive test matrix.

17. The non-transitory computer-readable medium of claim 12, wherein to determine a respective weight indicative of respective extensibility for each matrix of the second plurality of matrices based on the third plurality of matrices the processing circuitry is to:
   calculate a respective number of incident cycles of at most a predetermined length for each respective matrix of the third plurality of matrices; and
   determine the weight for each respective matrix of the second plurality of matrices based on the respective calculated number of incident cycles of at most the predetermined length.

18. The non-transitory computer-readable medium of claim 17, wherein to calculate a respective number of incident cycles of at most a predetermined length for each respective matrix of the third plurality of matrices the processing circuitry is to:
   generate a respective Tanner graph that represents the respective matrix; and
   determine the number of incident cycles of at most the predetermined length in the respective Tanner graph.

19. The non-transitory computer-readable medium of claim 18, wherein to determine the number of incident cycles of at most the predetermined length in the respective Tanner graph the processing circuitry is to evaluate for incident cycles of at most the predetermined length by using a Fossorier Condition for the respective Tanner Graph.

20. The non-transitory computer-readable medium of claim 17, wherein to determine the weight for each respective matrix of the second plurality of matrices based on the respective calculated number of incident cycles of at most the predetermined length the processing circuitry is to:
   determine the weight for a respective matrix of the second plurality of matrices based on the calculated number of incident cycles of at most the predetermined length for each matrix of the third plurality of matrix generated based on the respective matrix of the second plurality of matrices.

21. The non-transitory computer-readable medium of claim 12, wherein to select at least one matrix from the second plurality of matrices based on the weights of the second plurality of matrices the processing circuitry is to select at least one matrix from the second plurality of matrices wherein the selected matrices correspond to a maximum weight among the determined weights.

22. The non-transitory computer-readable medium of claim 12, wherein the processing circuitry is further to: repeat (a)-(f) for a predetermined number of iterations.

* * * * *